United States Patent
Naor et al.

(10) Patent No.: US 10,609,837 B2
(45) Date of Patent: Mar. 31, 2020

(54) DATA STORAGE SYSTEM

(71) Applicant: STORONE LTD., Ra'anana (IL)

(72) Inventors: Gal Naor, Givat Shmuel (IL); Raz Gordon, Hadera (IL)

(73) Assignee: STORONE LTD., Ra'anana (IL)

( * ) Notice: Subject to any disclaimer, the term of this patent is extended or adjusted under 35 U.S.C. 154(b) by 0 days.

(21) Appl. No.: 15/513,531

(22) PCT Filed: Sep. 20, 2015

(86) PCT No.: PCT/IL2015/050950
§ 371 (c)(1),
(2) Date: Mar. 22, 2017

(87) PCT Pub. No.: WO2016/046816
PCT Pub. Date: Mar. 31, 2016

(65) Prior Publication Data
US 2017/0251567 A1    Aug. 31, 2017

Related U.S. Application Data

(60) Provisional application No. 62/054,030, filed on Sep. 23, 2014.

(51) Int. Cl.
*H05K 7/14* (2006.01)
*H05K 7/20* (2006.01)
*A47B 53/02* (2006.01)

(52) U.S. Cl.
CPC ........... *H05K 7/1497* (2013.01); *A47B 53/02* (2013.01); *H05K 7/20745* (2013.01)

(58) Field of Classification Search
CPC .... H05K 7/1497; H05K 7/20745; H05K 7/20; A47B 53/00; A47B 53/02; A47B 49/00;
(Continued)

(56) References Cited

U.S. PATENT DOCUMENTS 865,268 A * 9/1907 Powell ...................... A47F 7/30
211/175
4,307,922 A * 12/1981 Rhodes, Jr. ............ A47B 53/02
104/288

(Continued)

FOREIGN PATENT DOCUMENTS

CN    1464770 A    12/2003
CN    1891585 A    1/2007
(Continued)

OTHER PUBLICATIONS

International Search Report and Written Opinion of PCT/IL2015/050950 dated Dec. 14, 2015.
(Continued)

*Primary Examiner* — Jennifer E. Novosad
(74) *Attorney, Agent, or Firm* — Roberts Calderon Safran & Cole, P.C.

(57) ABSTRACT

A data storage center comprising a plurality of cabinets configured with one or more racks. The racks are configured for accommodating one or more appliances. At least one of said cabinets is displaceable to facilitate access to the respective racks of said cabinet and to racks of a neighboring cabinet of said cabinets.

18 Claims, 4 Drawing Sheets

(58) Field of Classification Search
CPC ........... A47B 61/102; E04H 9/00; E04H 9/10;
E04H 1/12; E04H 9/16; E04B 1/343;
E04B 1/348; B65G 1/00; B65G 1/026;
B65G 1/023; A47F 5/0093; A47F 5/02
USPC ...... 211/151, 162; 52/234; 361/679.53, 698,
361/699, 724, 728, 729, 730;
312/198–201
See application file for complete search history.

(56) References Cited

U.S. PATENT DOCUMENTS

| | | | | |
|---|---|---|---|---|
| 4,723,819 | A * | 2/1988 | Ramberg | A47F 7/08 |
| | | | | 211/129.1 |
| 5,057,977 | A * | 10/1991 | Kurzman | A47F 3/063 |
| | | | | 312/122 |
| 5,160,189 | A * | 11/1992 | Johnston | A47B 53/00 |
| | | | | 188/82.2 |
| 5,333,983 | A * | 8/1994 | Hatouchi | A47B 53/02 |
| | | | | 211/1.57 |
| 5,924,779 | A * | 7/1999 | Krumholz | A47B 88/42 |
| | | | | 211/151 |
| 5,967,346 | A * | 10/1999 | Price, Jr. | A47B 53/00 |
| | | | | 211/162 |
| 6,112,917 | A * | 9/2000 | Baker | A47B 53/02 |
| | | | | 211/162 |
| 6,241,106 | B1 * | 6/2001 | Fujita | A47B 53/02 |
| | | | | 211/134 |
| 6,845,721 | B1 | 1/2005 | Doucet et al. | |
| 7,641,063 | B2 * | 1/2010 | Wishart | A47B 47/027 |
| | | | | 211/189 |
| 7,652,889 | B2 | 1/2010 | Larson et al. | |
| 8,514,572 | B2 | 8/2013 | Rogers | |
| 8,567,883 | B2 * | 10/2013 | Hsiao | H05K 7/1488 |
| | | | | 312/201 |
| 8,607,996 | B2 * | 12/2013 | Yang | H05K 7/1489 |
| | | | | 211/162 |
| 8,733,812 | B2 | 5/2014 | Slessman | |
| 8,827,090 | B2 * | 9/2014 | Kropveld | B65G 1/026 |
| | | | | 211/113 |
| 8,947,879 | B2 * | 2/2015 | Broome | H05K 7/1497 |
| | | | | 165/104.33 |
| 9,161,638 | B2 * | 10/2015 | Ehmke | A47F 3/00 |
| 9,414,672 | B1 * | 8/2016 | Flynn | A47B 53/02 |
| 9,795,062 | B1 * | 10/2017 | Ross | H05K 7/20745 |
| 9,826,833 | B2 * | 11/2017 | Chen | A47B 87/008 |
| 9,999,301 | B2 * | 6/2018 | Stauffer | A47B 47/021 |
| 2006/0082263 | A1 * | 4/2006 | Rimler | B60P 3/14 |
| | | | | 312/201 |
| 2008/0094797 | A1 * | 4/2008 | Coglitore | H05K 7/1497 |
| | | | | 361/679.5 |
| 2008/0239659 | A1 | 10/2008 | Kundapur | |
| 2009/0229194 | A1 * | 9/2009 | Armillas | E04H 1/1205 |
| | | | | 52/79.1 |
| 2009/0326721 | A1 * | 12/2009 | Sugiyama | F24F 11/0001 |
| | | | | 700/282 |
| 2010/0048119 | A1 * | 2/2010 | Tashiro | H05K 7/20745 |
| | | | | 454/184 |
| 2010/0110626 | A1 * | 5/2010 | Schmitt | H05K 7/1497 |
| | | | | 361/679.47 |
| 2010/0290197 | A1 * | 11/2010 | Bergthold | H05K 7/1457 |
| | | | | 361/729 |
| 2010/0307716 | A1 * | 12/2010 | Bean, Jr. | H05K 7/20745 |
| | | | | 165/80.2 |
| 2011/0083824 | A1 * | 4/2011 | Rogers | H05K 7/20745 |
| | | | | 165/80.2 |
| 2011/0306288 | A1 * | 12/2011 | Murayama | F24F 11/0001 |
| | | | | 454/184 |
| 2012/0300398 | A1 | 11/2012 | Eckberg et al. | |
| 2013/0032310 | A1 | 2/2013 | Jaena et al. | |
| 2014/0240917 | A1 * | 8/2014 | Nicolai | H05K 7/20745 |
| | | | | 361/679.47 |
| 2016/0169713 | A1 * | 6/2016 | Graff | G01K 1/024 |
| | | | | 73/431 |
| 2016/0198846 | A1 * | 7/2016 | McCuistion | A47B 53/02 |
| | | | | 211/150 |
| 2017/0251567 | A1 * | 8/2017 | Naor | H05K 7/20745 |

FOREIGN PATENT DOCUMENTS

| | | |
|---|---|---|
| CN | 101815423 A | 8/2010 |
| CN | 201700121 U | 1/2011 |
| CN | 102625622 A | 8/2012 |
| CN | 103718663 A | 4/2014 |
| EP | 2101017 A2 | 9/2009 |
| JP | H11225835 A | 8/1999 |
| JP | 2013-149905 A | 8/2013 |
| JP | 2014-006574 A | 1/2014 |
| WO | 2013/016568 A1 | 1/2013 |

OTHER PUBLICATIONS

Japanese Office Action issued in Application No. 2017-516765 dated Jun. 18, 2019, 5 pages.

* cited by examiner

DATA STORAGE SYSTEM

TECHNOLOGICAL FIELD

The present subject matter is concerned with a data storage system. More particularly, the disclosure is directed to a space saving data storage system.

BACKGROUND

Storage data centers are facilities used to house computer storage systems and associated components such as data communications connections, power supplies and environmental controls, namely air conditioning, humidity control, fire/smoke detection and suppression systems, various security devices, shake detection and suppression, etc. Data centers are ever-growing and storage space is becoming a serious issue. There is thus a need for a new storage system and method.

GENERAL DESCRIPTION

According to one aspect of the presently disclosed subject matter, there is provided a data storage center comprising a plurality of cabinets configured with one or more racks. The racks are configured for accommodating one or more appliances. At least one of said cabinets is displaceable to facilitate access to the respective racks of said cabinet and to racks of a neighboring cabinet of said cabinets.

The term appliance/appliances as used herein in the specification and claims denotes any form of data storage and communication equipment.

The arrangement is such that a duty service aisle extends neighboring a selected cabinet and is configured for servicing same, i.e. facilitating access to install/remove and service the data storage and communication appliances.

According to a primary object of the present disclosure there is a data storage center with an improved volume/storage ratio, i.e. maximizing storage capacity within a given space by eliminating multiple aisles between cabinets, or substantially reducing the number of such aisles, thereby improving utilization of a given floor space.

A data storage center according to the present disclosure can be installed within any enclosure, i.e. any structure either stationary or mobile, e.g. mountable for locomoting.

The term rack as used hereinafter in the specification and claims denotes a shelf like compartment for supporting and electrically coupling data storage and communication appliances.

The term data storage and communication appliances as used hereinafter in the specification and claims denotes computer memory/storage systems, computer units, servers, communication modules, electric power units, etc.

The term floating isle gap as used hereinafter in the specification and claims denotes the maximal space between two neighboring cabinets, said space facilitating servicing the data storage center and communication appliances supported within said two neighboring cabinets. The floating isle gap can also extend between end cabinets within the enclosure, namely between a wall of the enclosure and a neighboring cabinet.

The term environmental control as used hereinafter in the specification and claims denotes at least a temperature controlling system. However, environmental control can include also humidity governing systems, air purifying systems, etc.

According to a particular example of the present disclosure there is provided a data storage center comprising a confined space accommodating a plurality of parallely disposed cabinets and configured with an array of racks which in turn are configured for accommodating a plurality of data storage and communication appliances; at least some of the cabinets are displaceable within the confined space, with at least a floating isle gap between neighboring cabinets extending within the confined space; wherein one or more of the cabinets is associated with a data communications, electric power supply and environmental controls.

The arrangement is such that the utilization of a given floor space within a given confined space can be dramatically increased by minimizing isle space required between each two cabinets to a floating isle gap (a so-called duty isle gap, or s duty service isle). Accordingly, where the length and width of each cabinet are given, the parameter that can be altered is the redundant isle space between the cabinets, which can be eliminated and replaced by the floating isle gap which is exposed between two neighboring cabinets, or between an end cabinet and a neighboring wall, to facilitate access and service to the data storage and communication appliances mounted on the racks of the side of the duty cabinet/s facing the floating isle gap.

Thus, where an enclosure is fitted with a plurality of parallel disposed cabinets, each of particular height, width and length, the effective width ($W_{Eff}$) of the cabinets is:

$$W_{Eff} = \Sigma_1^n W_i + W'$$

Where:
$W_i$ denotes the width of cabinet i;
$W'$ denotes the width of a floating isle gap, namely a maximal gap between two neighboring cabinets;
n denotes the number of parallel disposed cabinets within the enclosure.

Any one or more of the following features, design and configurations can be associated with a data storage center according to the present disclosure, separately or in combinations thereof:

- The cabinets can be configured for displacement within the enclosure either manually or motorized;
- The cabinets can be displaceable over parallely disposed rails within the enclosure; the cabinets can be displaceable parallel to one another;
- The cabinets can be configured with a dampening system for reducing shocks imparted to the cabinets upon collision with neighboring cabinets and/or shakes;
- The dampening system can be associated with the cabinets and or with a rail/track system supporting the cabinets;
- The environmental controls can be configured with a temperature controlling system (in particular a cooling system);
- The environmental controls can be configured with a humidity control system;
- The environmental controls can be configured with an air filtration system;
- Each of the cabinets is articulated with an environmental controls, wherein climate controlling fluid flow can take place through a conduit associated with a respective cabinet;
- The enclosure can be configured with additional environmental controls, irrespective of those articulated with the cabinets;
- The climate controlling fluid flow conduit can be fixedly articulated with a cabinet and thus be configured for displacing along with the respective cabinet;

The climate controlling fluid flow conduit can be a stationary flow port extending from the enclosure and configured for engaging with a respective pickup flow port of a respective cabinet;

The climate controlling unit associated with each cabinet can be independent or part of a central system;

The stationary flow port can be configured for shut off at the event that a cabinet is disengaged therefrom;

Each cabinet can be configured with one or more climate control systems, depending on the amount of heat generated by the data storage and communication appliances mounted on a respective cabinet;

The storage data center can be configured with a plurality of climate controlling sensors associated with the enclosure and/or with one or more of the cabinets, so as to monitor environmental parameters such as temperature, humidity, purity of the air, etc.;

The storage data center can be configured with fire/smoke detectors and with a fire suppression arrangement;

The cabinets can be configured with an anti-static arrangement;

The storage data center can be configured with an air filtering/purifying system;

The enclosure can be configured with one or more floating isle gaps along the length of the enclosure;

The floating isle gap has a width being substantially similar to the width of a rack of a cabinet. Accordingly, where a cabinet is a two sided cabinet (i.e. comprising storage racks at both sides thereof) the width of the gap corresponds substantially with half the width of the respective cabinet. Where the rack extends substantially the width of the cabinet, the width of the gap corresponds substantially with the width of the respective cabinet;

Where the rack extends substantially along the width of the cabinet, the data storage and communication appliances can be accessed from one side or from both sides of the cabinet;

Electric supply to the data storage and communication appliances can be through fixed wiring/cabling coupled to the cabinets, contactors, current collector, and the like;

Data communications of the data storage and communication appliances can be facilitated through fixed wiring articulated with each cabinet;

Data communications of the data storage and communication appliances can be facilitated through contactors [data port collectors];

Data communications of the data storage and communication appliances can be facilitated through wireless communication;

For practical reasons, the arrangement can be such that more than one floating isle gap is provided for a given number of cabinets, e.g. in case of large enclosures, and the like;

A cabinet may be segmented about its length, where segments of a cabinet can be locomoted jointly, as an integral unit, or each segment individually;

Some of the cabinets can be segmented and configured for displacing in a so-called side-to-side relation, i.e. along the length of the cabinet;

The cabinets can be locomoted over a trail/rack system articulated to the floor and/or suspended from the ceiling of the enclosure;

The racks can be configured with snap coupling ports for fast coupling/detaching of the data storage and communication appliances.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which.

DETAILED DESCRIPTION OF EMBODIMENTS

Figure 1A:
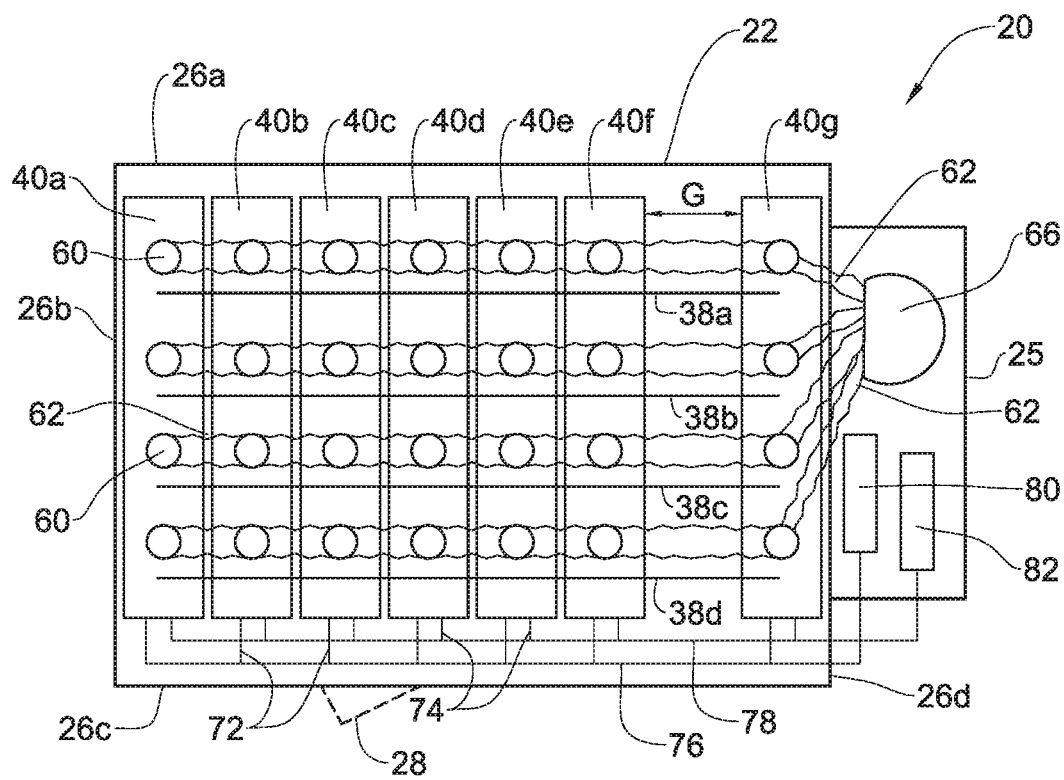
FIG. 1A is a schematic top view of a data storage center according to an example of the present disclosure.
Figure 1B:
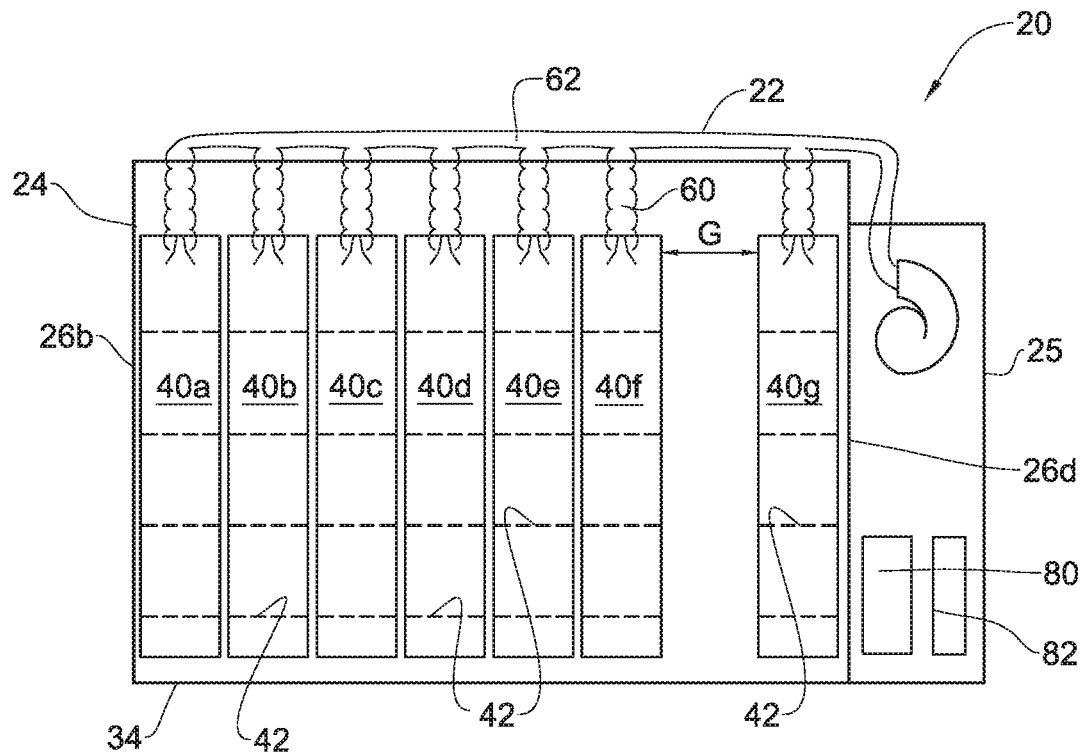
FIG. 1B is a schematic side view of the data storage center of FIG. 1A.
Figure 1C:
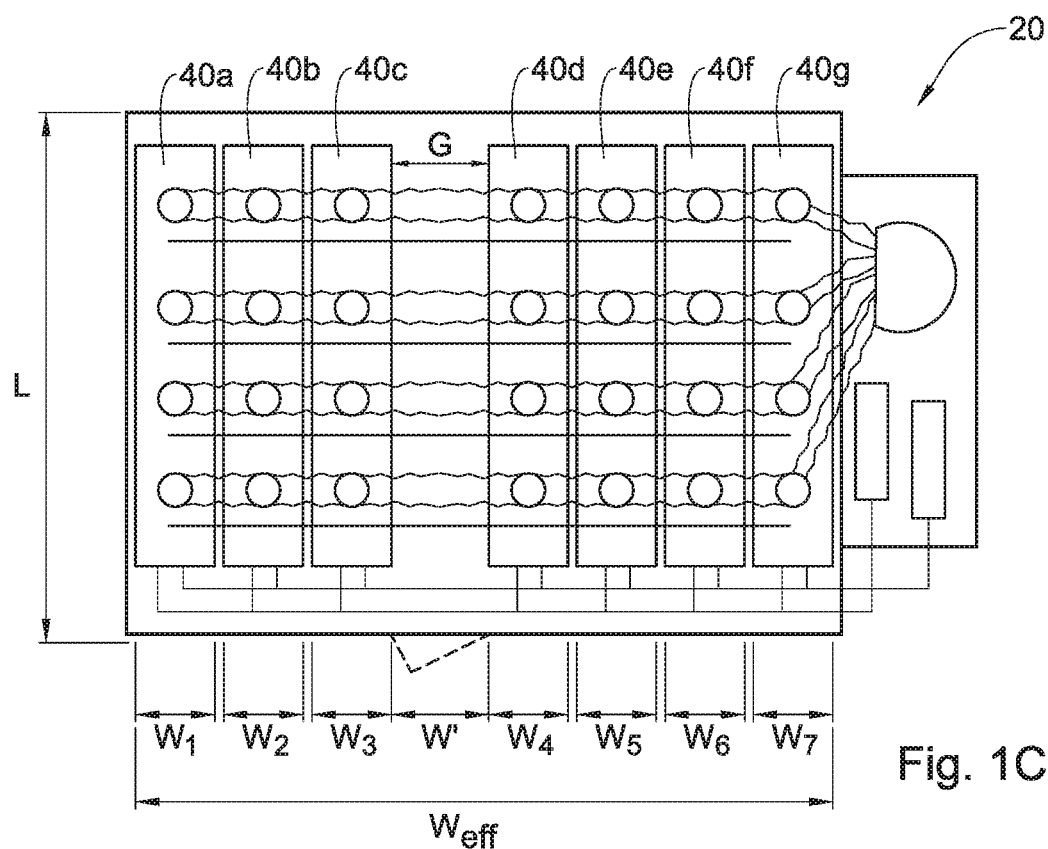
FIG. 1C is a schematic top view of the storage data center of FIG. 1A, some cabinets of which are displaced.

Attention is directed first to FIGS. 1A to 1C of the drawings, directed to a data storage system generally designated 20, according to a first example of the disclosure.

The data storage system 20 comprises an enclosure 22 which in the present example is a structure comprising a confined space in the form of a storage hall 24 and a support section 25 articulated thereto. The storage hall 24 is configured with four side walls 26a to 26d, a door 28 formed in side wall 26c, a ceiling 32 (FIG. 1B) and a solid floor 34.

It is appreciated that the present disclosure is a mere example and that the data storage system can in fact be assembled at any suitable location e.g. a confined space or a space within a larger space.

The floor 34 is fitted with four parallely extending rails 38a to 38d, fixedly articulated thereto. At the event that the data storage system is configured for bearing heavy loads, the floor has to be reinforced, as known in the art.

It is further appreciated that whilst in the particular example the cabinets are displaceable over rails, other locomotive configurations can be facilitated, such as wheels, grooves, magnetic rails, suspension rails and the like.

According to the particularly illustrated example, data storage system 20 comprises seven cabinets designated 40a to 40g, wherein end cabinets 40a and 40g are stationary cabinets and cabinets 40b to 40f are displaceable and are articulated to the rails 38a to 38d and configured for smooth siding there over, in a parallel relationship. However, according to the disclosure all or some of the cabinets are displaceable, wherein displacement of the cabinets can be facilitated manually, i.e. pushing/pulling, or by mechanical gearing e.g. deploying a manipulating system such as chain and gear train with the aid of a rotatable manipulator 39 (FIG. 4), and optionally by an electric motor (not shown).

Noting the sensitive nature of the gear mounted on the racks, it is noted that the locomotive system can be configured with a shock observing system for dampening and suppressing possible impact of the cabinets against each other upon displacement thereof.

Figure 4:
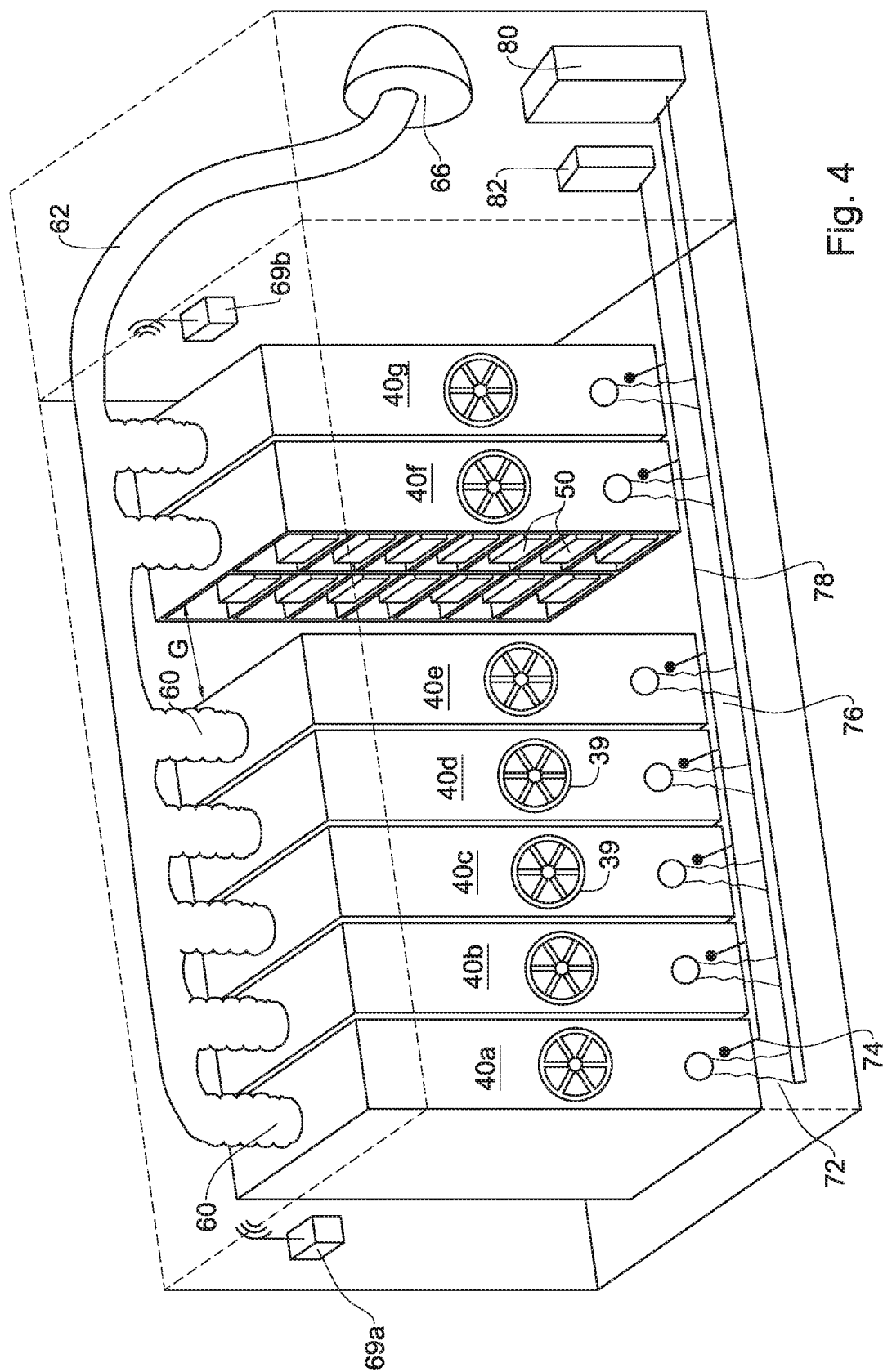
FIG. 4 is perspective representation of a storage data center according to the present disclosure.

Each of the cabinets 40a to 40g is configured with a plurality of racks represented in FIG. 1B by dashed lines designated 42 though better appreciated in FIG. 4. Each of the racks 42 is configured for accommodating a variety of data storage and communication appliances, such as computer memory/storage systems, computer units, servers, communication modules, electric power units, schematically illustrated and collectively referred to hereinafter as DSCA and designated 50 (FIG. 4). The racks 42 are configured with a plurality of data ports and power sockets for articulation to the DSACs and preferably, such ports and sockets are quick-release type couplings. The racks 42 can be modular (as far as height, couplings, sockets etc.), i.e. can be easily modified in size so as to accommodate different DSACs.

The data ports and power sockets of each of the cabinets 40a to 40g extend to a communications port 72 and power port 74, which ports are in communication with a main communications line (dash-doted line 76 in FIG. 1A) and a main power line 78 (dashed line 78 in FIG. 1A), which respectively extend into the support section 25 to a central communication facility 80 and a central power backup 82.

It is appreciated that data communication to/from the DSACs, and power supply to the DSACs can be facilitated by flexible cabling. Alternatively, data contactors and/or power contactors can be used, so as to facilitate data and power transfer to the cabinets, however without interfering with their mobility within the enclosure and without there occurring any momentarily discontinuities of data communication or power supply.

Noting the nature of the DSCAs, namely electric components emitting considerable heat and requiring cooling system for maintain their proper operation, the cabinets 40a to 40g are configured with an environmental control system comprising at least a cooling and or heat evacuating system. In the example of FIGS. 1A to 1C, the environmental control system associated with each of the cabinets 40a to 40g is a flexible fluid conduit 60 (e.g. bellows type conduit etc.) branching from supply lines 62 and which extend to a central air cooling unit 66 disposed at the support section 25. The flexible piping 62 renders the displaceable cabinets with controlled climate in spite their displacement. It is noted that the support section 25 can be disposed at any location in the vicinity of the data storage system.

It is appreciated that according to other configurations (not illustrated) the environmental control system can comprise in addition to cooling units, or instead, heat extractors, heat changers, other types of heat control units such as thermoelectric (peltier) units, etc., and combinations thereof, Furthermore, it is appreciated that additional one or more environmental controls can be associated with each of the cabinets, such as temperature and humidity controls, etc. Also, air treating units such as drying units, purifying/filtering units, etc. can be installed. In addition, the enclosure or each cabinet can be fitted with a variety of sensors of sensing and controlling the environmental parameters, and additional parameters such as quake sensors, smoke/fire detectors and suppressors 69a and 69b (FIG. 4).

In FIGS. 1A and 1B, the cabinets are disposed as follows: end cabinets 40a and 40g are stationary and are thus disposed in proximity to the respective side walls 26b and 26d. Cabinets 40b to 40f are all disposed to the left, in close proximity to cabinet 40a and in close proximity to one another, thereby giving rise to a floating isle gap G extending between cabinet 40f and cabinet 40g.

Turning now to FIG. 1C, the cabinets 40d to 40f are displaced all the way to the left, in close proximity to cabinet 40g and in close proximity to one another, thereby giving rise to a floating isle gap G, now extending between cabinet 40c and cabinet 40d.

The arrangement is such that the utilization of a given floor space within the given enclosure 22 is substantially increased by avoiding redundant isle space between each two neighboring cabinets, and instead a floating isle gap G is configured. Accordingly, where the length L (FIG. 1C) and width $W_i$ of each cabinet 40a to 40g are given, the parameter that can be altered is the redundant isle space between the cabinets, now eliminated and replaced by the floating isle gap G which is exposed between any two neighboring cabinets, or between an end cabinet and a neighboring side wall, to facilitate access and service to the DSCAs mounted on the racks 42 of the side of the duty cabinet facing the floating isle gap.

Thus, where an enclosure 22 is fitted with a plurality of parallel disposed cabinets, each of particular height, width and length, the effective width ($W_{Eff}$) of the cabinets is:

$$W_{Eff} = \Sigma_2^n W_i + W'$$

Where:
$W_i$ denotes the width of cabinet i;
W' denotes the width of a floating isle gap, namely a maximal gap between two neighboring cabinets;
n denotes the number of parallel disposed cabinets within the enclosure.

The width of the enclosure 22 is substantially equal to the effective width $W_{Eff}$.

It is appreciated that according to the present example five isles have been eliminated (assuming the tow end cabinets 40a and 40g are stationary and are accessible from their inside face), and however designating a single floating isle gap G. It should be noted that in large facilities it may be required that additional floating isle gap be allocated, so as to enable two or more simultaneously operative gaps between cabinets within an enclosure.

Figure 2:
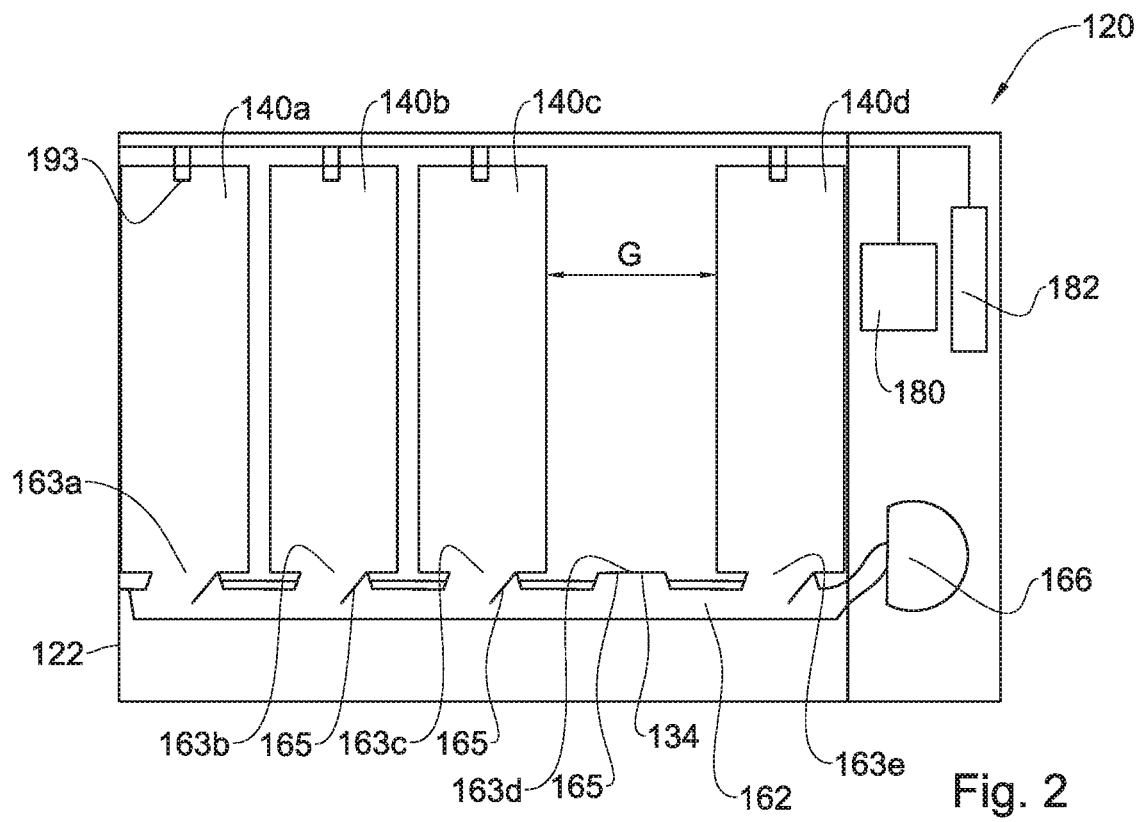
FIG. 2 is a schematic side view of a storage data center according to another example of the present disclosure.

Turning now to FIG. 2 of the drawing, there is schematically illustrated a data storage system generally designated 120, according to a second example of the disclosure.

The enclosure 122 accommodates n cabinets (four in the schematic example; designated 140a to 140d) slidable over support rails (not shown). It is appreciated that the principal of a floating isle gap G is maintained, whereby the servicing isle now extending between cabinets 140c and 140d can extend between any of the cabinets or between one of the end cabinets (140a or 140d) and a respective side wall.

However, in the present example the cabinets are displaceable over a 'floating floor' 134 and wherein a controlled air duct 162 is disposed under said floor 134, extending from a central air treating and cooling unit 166 towards a plurality of ports 163a to 163e, each extending in register with a potential address (location) of a cabinet. The arrangement is such that each port is configured with a selectively sealable gate 165. In the illustrated position ports 163a to 163c and port 163e extend opposite and in register with corresponding inlet openings of the respective cabinets 140a to 140c and 140d, whilst gate 165 of unoccupied port 163d is shut, namely at the location of the floating isle gap G, it is appreciated that according to another configuration, the unoccupied port 163d can remain open and thus contribute to controlling temperature within the enclosure.

In addition to the above, all communications between the central communication facility 180 and the cabinets 163a to 163e (namely with the DSCAs mounted over the racks in the cabinets), as well as connectivity with the central power and backup unit 182 takes place by contactors 193 engaged with communication and power lines schematically represented by line 195.

Figure 3:
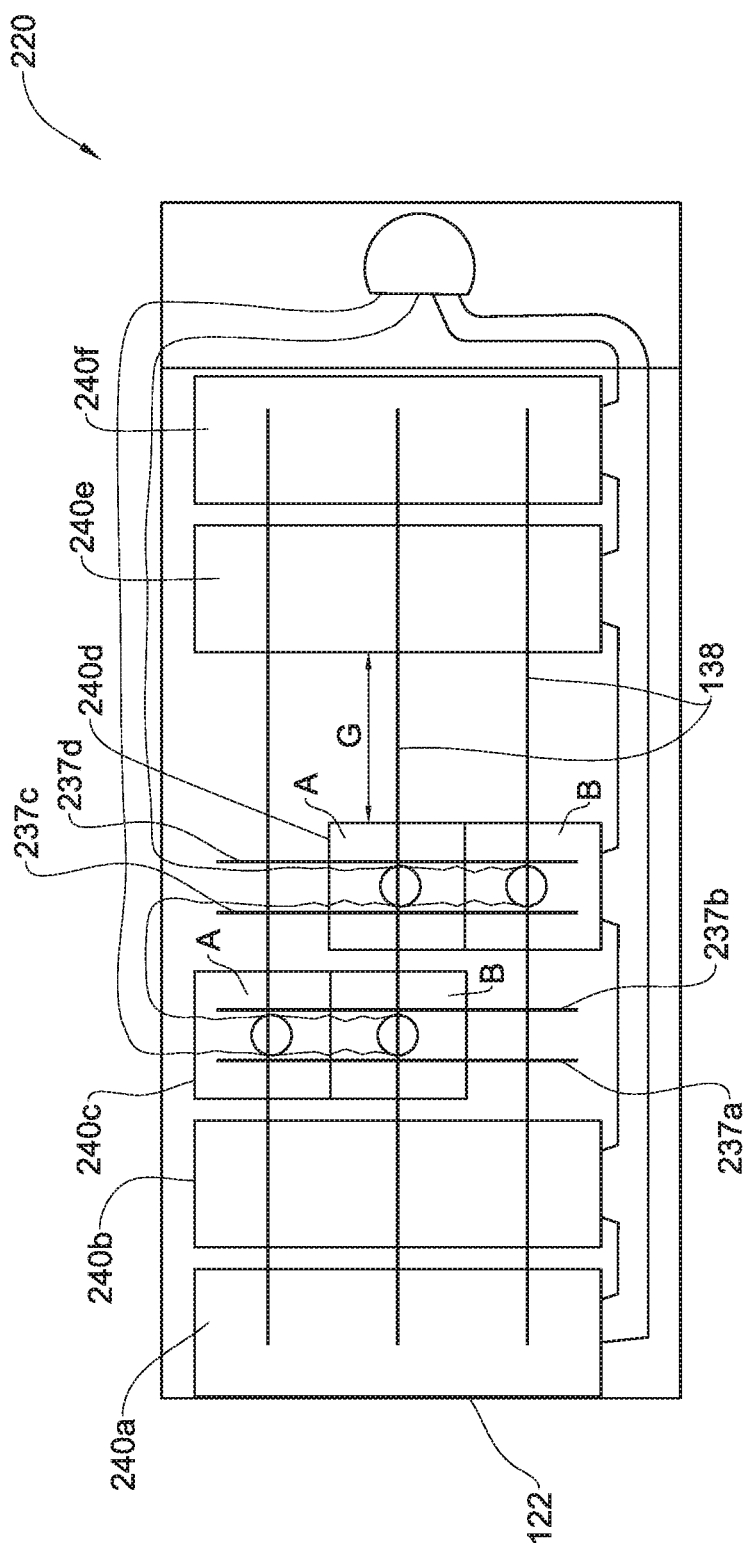
FIG. 3 is a schematic top view of a storage data center according to yet another example of the present disclosure.

The schematic representation of FIG. 3 illustrates yet another example of a data storage system generally designated 220 wherein an enclosure 222 is configured with six cabinets 240a to 240f, of which endmost cabinets 240a and 240f are stationary and extend in proximity to side walls of the enclosure. Cabinets 240*b* to 240*e* are displaceable along parallel rails 138 following the principal disclosed hereinabove, namely floating isle gap G is maintained, whereby the servicing isle now extending between cabinets 240*d* and 240*e*, though it can extend between any two cabinets or between one of the end cabinets and a respective side wall.

However, in the present example, cabinets 240*c* and 240*d* are segmented, namely each composed of two sub compartments A and B and are each positioned, at the currently illustrated position, over transverse paired rails 237*a* to 237*d*. This arrangement renders displacing segments A or B of a respective cabinet along the transverse rails 237*a* to 237*d*, thus facilitating servicing access to intermediate portions of the respective cabinets 240*c* and 240*d*. Apart from that it is appreciated that each of the cabinets is configured with the same features as discussed hereinabove, namely temperature and environmental control, communications coupling and power supply, etc.

The invention claimed is:

1. A data storage center comprising:
a plurality of cabinets disposed within an enclosure defining a confined space, said plurality of cabinets being configured with one or more racks, said racks being configured for accommodating one or more appliances;
environmental controls associated with said plurality of cabinets, said environmental controls being configured for establishing a fluid path between a central unit and an interior of the respective cabinet for passage of a climate controlling fluid therebetween, said fluid path being isolated from the confined space;
wherein at least one of said cabinets is slidable in a first direction and at least between a first position and a second position in a second direction perpendicular to the first direction to facilitate access to the respective racks of said at least one cabinet and to racks of a neighboring cabinet of said at least one cabinet;
wherein the sliding of said at least one cabinet in the first direction forms a floating isle gap between said at least one cabinet and the neighboring cabinet of said at least one cabinet, wherein the floating isle gap is a floating gap in the first direction; and
wherein said at least one cabinet is slidable in the first direction at least when said at least one cabinet is at the first position and at least when said at least one cabinet is at the second position.

2. A data storage center according to claim 1, further comprising an enclosure defining a confined space in which said cabinets are disposed.

3. A data storage center according to claim 2, wherein said at least one cabinet is slidable within said confined space.

4. A data storage center according to claim 3, wherein said cabinets are parallel with respect to each other and each having a width $W_i$, said floating isle gap having a width W', and wherein an effective width ($W_{Eff}$) of the cabinets is: $W_{Eff} = \Sigma_1^n W_i + W'$, where n is a number of said cabinets and i is a number of a particular cabinet and having a value of 1 to n.

5. A data storage center according to claim 4, wherein a width of said confined space is substantially equal to $W_{Eff}$.

6. A data storage center according to claim 4, wherein the width Wi is identical in all the cabinets and is substantially equal to width W'.

7. A data storage center according to claim 4, wherein the width W' is substantially equal to a width of the racks of said cabinets.

8. A data storage center according to claim 1, wherein the sliding of the at least one of said cabinets in the first or the second direction is manual or motorized.

9. A data storage center according to claim 1, wherein the at least one cabinet is slidable in the first direction over parallely disposed rails.

10. A data storage center according to claim 1, wherein the environmental controls associated with said cabinets are configured for providing environmental control to the appliances thereof.

11. A data storage center according to claim 10, wherein the environmental controls comprise at least one of: a temperature controlling system, a humidity control system, and an air filtration system.

12. A data storage center according to claim 10, wherein said association with said cabinets is provided by a climate controlling fluid flow conduit articulated to respective cabinet.

13. A data storage center according to claim 12, wherein said climate controlling fluid flow conduit is displaceable with its respective cabinet being slid.

14. A data storage center according to claim 1, further comprising a plurality of climate controlling sensors associated with the enclosure defining the confined space in which said cabinets are disposed or with one or more of the cabinets, so as to monitor environmental parameters such as temperature, humidity, and purity of air.

15. A data storage center according to claim 1, further comprising data communications associated with said cabinets for providing data communication to the appliances of the cabinet, wherein the data communications is facilitated through fixed wiring articulated with said cabinets or through wireless communication.

16. A data storage center according to claim 1, wherein the at least one cabinet is segmented.

17. A data storage center according to claim 1, wherein the cabinets are slidable over a rail system articulated to a floor or suspended from a ceiling of the enclosure defining the confined space in which said cabinets are disposed.

18. A data storage center according to claim 1, wherein said at least one cabinet is slidable simultaneously with at least another of said cabinets.

* * * * *